US008258607B2

(12) United States Patent
Wheless, Jr. et al.

(10) Patent No.: US 8,258,607 B2
(45) Date of Patent: Sep. 4, 2012

(54) APPARATUS AND METHOD FOR PROVIDING BYPASS CAPACITANCE AND POWER ROUTING IN QFP PACKAGE

(75) Inventors: Thomas Omega Wheless, Jr., Eagle, ID (US); Randall Don Briggs, Boise, ID (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1676 days.

(21) Appl. No.: 11/254,088

(22) Filed: Oct. 19, 2005

(65) Prior Publication Data

US 2007/0085174 A1     Apr. 19, 2007

(51) Int. Cl.
*H01L 23/48* (2006.01)
*H01L 23/495* (2006.01)

(52) U.S. Cl. ................. 257/666; 257/E23.031; 257/686

(58) Field of Classification Search .......... 257/666–677, 257/700, 758, 777, 787, 686, 678, E23.031, 257/E23.004, E23.03–23.05, E23.059
See application file for complete search history.

(56) References Cited

U.S. PATENT DOCUMENTS

| | | | |
|---|---|---|---|
| 4,989,117 A | | 1/1991 | Hernandez |
| 5,283,717 A | * | 2/1994 | Hundt ........................ 361/813 |
| 5,800,958 A | | 9/1998 | Manteghi |
| 6,400,576 B1 | | 6/2002 | Davidson |
| 6,482,674 B1 | * | 11/2002 | Kinsman ..................... 438/106 |
| 6,849,951 B1 | | 2/2005 | Trimberger et al. |
| 2005/0012159 A1 | | 1/2005 | Sekimoto |

* cited by examiner

*Primary Examiner* — Hoa B Trinh (57) ABSTRACT

An integrated circuit packaging apparatus includes a first conductive layer disposed between an integrated circuit die and a conductive die paddle. Bond wires connect the first conductive layer to the lead frame package and to the integrated circuit die. A first dielectric layer is disposed between the first conductive layer and the conductive die paddle such that the first conductive layer, the first dielectric layer, and the conductive die paddle provide bypass capacitance. A method for providing bypass capacitance and power routing for an integrated circuit packaging apparatus includes; depositing a first dielectric layer on a conductive die paddle, depositing a first conductive layer on the first dielectric layer, and connecting the first conductive layer to the lead frame package and to the integrated circuit die. The first conductive layer, the first dielectric layer, and the conductive die paddle cooperate to provide bypass capacitance.

6 Claims, 6 Drawing Sheets

APPARATUS AND METHOD FOR PROVIDING BYPASS CAPACITANCE AND POWER ROUTING IN QFP PACKAGE

BACKGROUND

The present invention relates generally to integrated circuit packaging devices, and, more particularly, to an apparatus and method for providing bypass capacitance and power routing in a quad flat pack (QFP) package.

Figure 1:
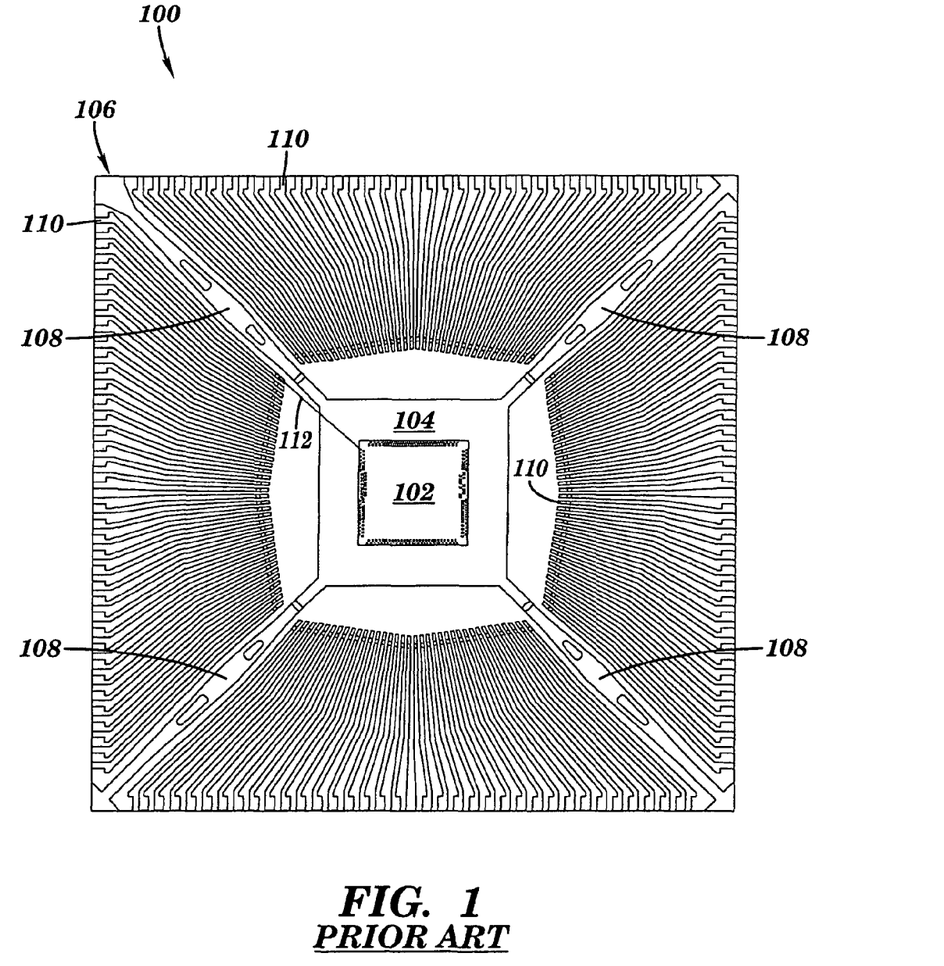
FIG. 1 illustrates a conventional quad flat pack (QFP) packaging assembly.

As is generally known in the art, an integrated circuit (IC) is formed on a small, substantially planar, piece of semiconductor material (e.g., silicon) referred to as a chip or integrated circuit die. A typical integrated circuit die includes a vast number of circuits therein and also features a plurality of bonding pads disposed on its top surface adjacent its peripheral edges. In a conventional quad flat pack (QFP) package assembly 100 such as shown in FIG. 1, the integrated circuit die 102 is mounted directly to a centrally located die paddle 104, which is part of a thin metal lead frame 106 that is typically stamped or chemically etched from strips of copper-containing containing materials. The die paddle is generally rectangular in shape and is supported at each of its four corners by a radially extending support beam 108.

The lead frame 106 further includes a plurality of thin, closely spaced conductive leads 110 whose inner ends radially extend away from the edges of the die 102. The inner ends of the conductive leads are also referred to as bonding fingers. Very small diameter gold bonding-wires 112 have one end thereof bonded to the corresponding bonding pads on the integrated-circuit die 102, and the other end thereof bonded to the corresponding bonding fingers 110. The entire assembly thus described may be encapsulated in a molded plastic material so as to form a molded-plastic package body.

Integrated circuits (including those mounted in QFP assemblies) typically include active circuits that can draw spikes of current from a local power supply line or bus. One example of an active circuit that may draw such a spike of current is a digital logic element disposed on an integrated circuit. The digital logic element has a $V_{CC}$ power lead that is coupled by a power ($V_{CC}$) bus network within the IC to the power $V_{CC}$ pads of the integrated circuit. Furthermore, the $V_{CC}$ pads of the IC are connected via bond wires 112 to the bonding fingers 110, and the bonding fingers are connected finally to a PC (printed circuit) board where the $V_{CC}$ supply is provided for the packaged IC. This path for supply current can be quite long and may have significant resistance and inductance associated therewith. When a signal on an input lead of the digital logic element switches from one digital logic level to another digital logic level, the digital logic element may draw a spike of current from the power supply line. This spike of current can include a crossover current that passes from the $V_{CC}$ power lead of the digital logic element through the digital logic element and to a ground lead of the digital logic element, or could also include a switching current needed to supply electrical charge to the load of the digital logic element such that the voltage on the output of the digital logic element can transition from one digital logic voltage to another.

Ideally, if the supply current path had no resistance or inductance, then the spike of current could be supplied to the digital logic element through the supply line without a significant drop in the voltage on the $V_{CC}$ power lead of the digital logic element. However, because some resistance and inductance is inherently associated with the power supply path, the voltage on the $V_{CC}$ power lead of the digital logic element may drop momentarily when the digital logic element switches from one digital logic level to another. Such a voltage drop can have undesirable consequences. For example, where the signal output from the digital logic element is to switch from a digital logic low to a digital logic high, the voltage on the $V_{CC}$ power lead of the as a digital logic element might momentarily dip to a level that is not recognized as a digital logic high. This voltage dip can delay the transition of the signal and can cause other problems.

Accordingly, one technique used to prevent undesirable dips in supply voltage to active devices is to provide bypass capacitors for the active devices. When an active device draws a spike of current, much of this current is supplied by a bypass capacitor, thereby reducing the magnitude of the current spike pulled through the $V_{CC}$ power supply line. By reducing the magnitude of the current spike conducted through the supply line, the magnitude of the associated voltage drop at the power supply lead of the active device is reduced as well. Conventionally, such bypass capacitors are located outside the QFP package on a printed circuit board. The inductance and resistance of the supply path reduce the effectiveness of a bypass capacitor from the capacitor to the supply lead of the logic element. This location suffers from the inductance and resistance of the leadframe, bondwire, and on-die power supply path that stands between the capacitor and a logic element disposed on an IC. Although this situation may be improved by locating discrete bypass capacitors within the QFP package, they are quite bulky and difficult to interconnect. Even inside the QFP package, these bypass capacitors still suffer some resistive and inductive losses due to their individual packaging and conductive interconnects to the IC.

SUMMARY

An integrated circuit packaging apparatus of the present invention is presented. The apparatus includes a lead frame and a conductive die paddle forming a part of the lead frame. The conductive die paddle is receptive to connection to a ground. The apparatus further includes an integrated circuit die. A first conductive layer is disposed between the integrated circuit die and the conductive die paddle. At least one bond wire connects the first conductive layer to the lead frame package. The lead frame package is receptive to a first voltage that is supplied by the bond wire to the first conductive layer. At least one bond wire connects the first conductive layer to the integrated circuit die for distributing the first voltage at the first conductive layer to the integrated circuit die. A first dielectric layer is disposed between the first conductive layer and the conductive die paddle such that the first conductive layer, the first dielectric layer, and the conductive die paddle provide bypass capacitance for the first voltage.

A method for providing bypass capacitance and power routing for an integrated circuit packaging apparatus of the present invention is presented. The method includes depositing a first dielectric layer on a conductive die paddle that forms a part of a lead frame. The conductive die paddle is receptive to connection to a ground. The method further includes depositing a first conductive layer on the first dielectric layer. Further, connecting the first conductive layer to the lead frame package such that a first voltage is supplied to the first conductive layer. Still further, connecting the first conductive layer to the integrated circuit die such that the first voltage at the first conductive layer is distributed to the integrated circuit die. The first conductive layer, the first dielectric layer, and the conductive die paddle cooperate to provide bypass capacitance for the first voltage. Also, disposing an integrated circuit die above the first conductive layer.

The above described and other features will be appreciated and understood from the following detailed description, drawings, and appended claims.

BRIEF DESCRIPTION OF THE DRAWINGS

Referring now to the figures, which are exemplary embodiments, and in which the like elements are numbered alike.

DETAILED DESCRIPTION

Disclosed herein is an apparatus and method for providing bypass capacitance and power routing in a QFP package. Briefly stated, a bypass distribution array is configured between an integrated circuit die and a grounded die paddle of the QFP package. The bypass distribution array includes at least one conductive layer isolated from the die paddle by at least one insulative layer. Thus configured, the conductive layer(s) form a top electrode of a bypass capacitor, the insulative layer(s) serve as the bypass capacitor dielectric, and the die paddle serves as a bottom electrode of the bypass capacitor. Moreover, through the use of the conductive layer(s) of the bypass distribution array, one or more levels of chip voltage can be provided to the chip through a low-inductance, low-resistance path utilizing relatively short bond wires. This in turn results in easier routing of the power pins of the IC, and allows for fewer power pins on the package.

Figure 2:
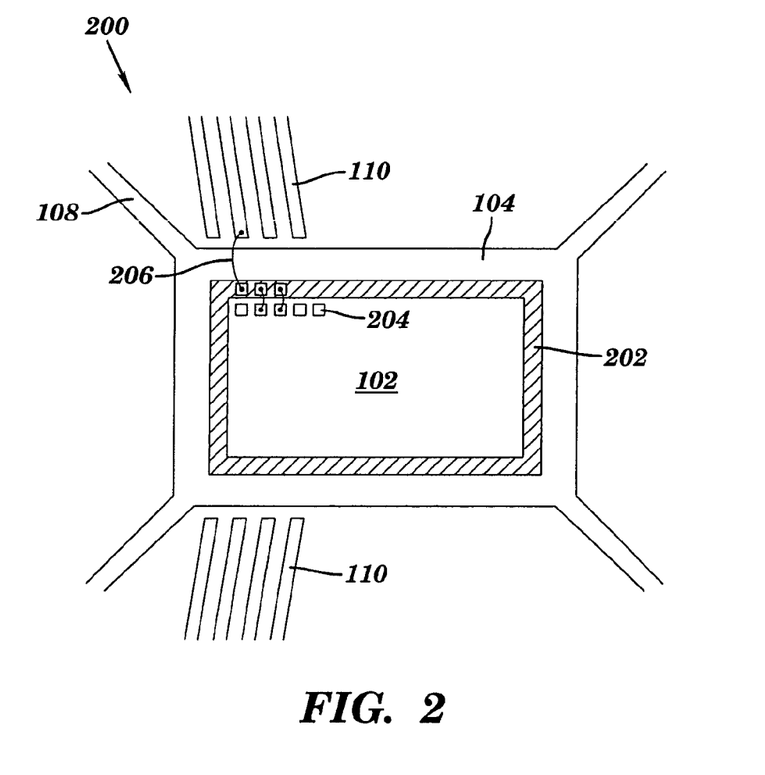
FIG. 2 is a top view of a QFP packaging assembly having a bypass distribution array, configured in accordance with an embodiment of the invention.
Figure 3:
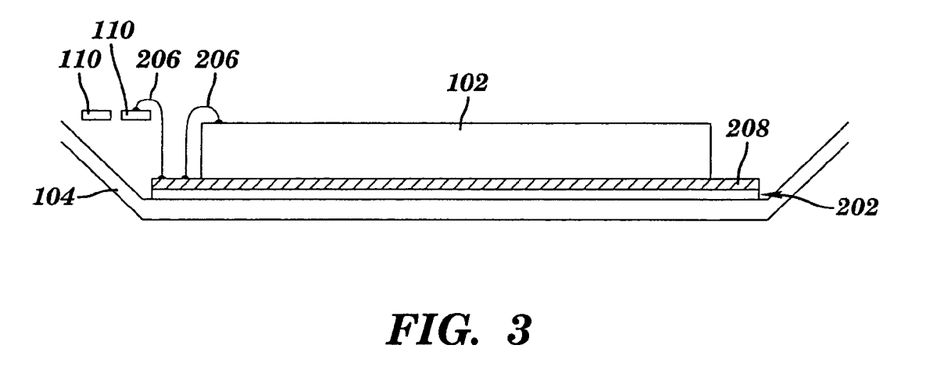
FIG. 3 is a side view of the QFP packaging assembly shown in FIG. 2.
Figure 4:
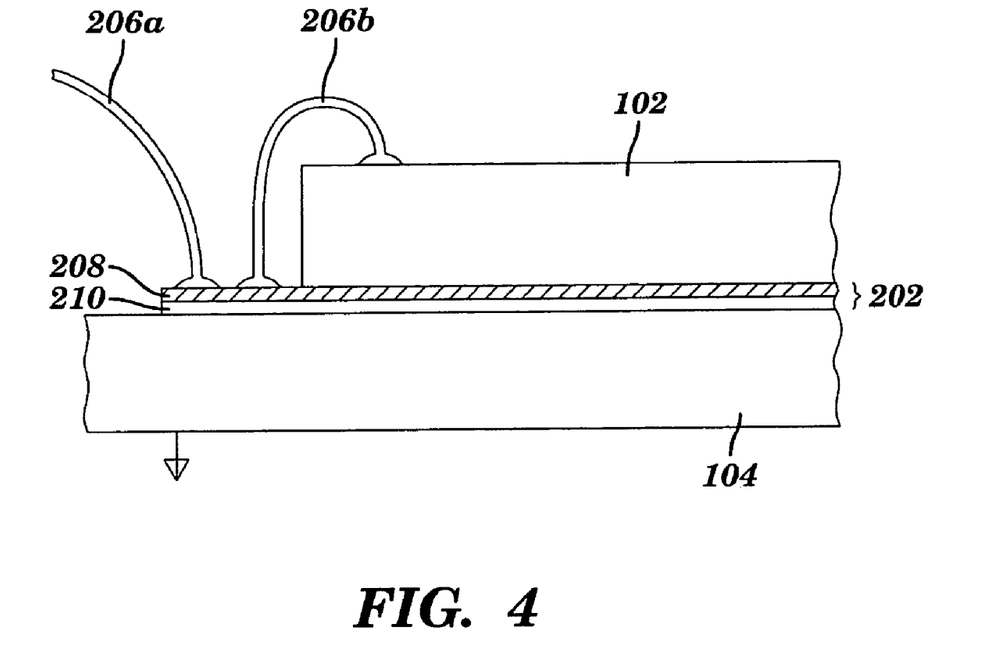
FIG. 4 is a more detailed view of the bond connections of FIG. 3.

Referring generally now to FIGS. 2-4, there is shown a QFP packaging assembly 200, configured in accordance with an embodiment of the invention. As is shown in the top view of FIG. 2, a bypass distribution array 202 is interposed between the IC die 102 and the die paddle 104 of the lead frame. The bypass distribution array 202, in one aspect, provides additional flexibility with regard to the distribution of chip voltages to the IC die 102, as connections can be configured around the perimeter of the array 202 for wire bonding to corresponding pads 204 on the chip with bond wires 206. As shown in the side view of FIGS. 3 and 4, the bypass distribution array 202 has at least two layers associated therewith. More specifically, the IC die 102 is attached to a first conductive layer 208 of the array 202, which in turn is formed over a first insulative layer 210 that also serves as a capacitive dielectric layer, with the die paddle 104 forming the other plate of the capacitor.

Assuming incoming bond wire 206a is connected between the lead frame (not shown in FIG. 4) of the QFP package 200 and the first conductive layer 208, and bond wire 206b is connected between the first conductive layer 208 and the IC die 102, then the array 202 can effectively serve as a low-inductance, low-resistance resistance power distribution apparatus by (for example) providing a perimeter around the die 102 from which a chip supply voltage can be efficiently routed to the $V_{CC}$ pads of the chip. Moreover, as the die paddle 104 is also a conductive material (which is grounded in an embodiment), the first insulative layer 210 of the array 202 between the first conductive layer 208 and the die paddle 104 further acts as a dielectric material for a bypass capacitor defined by the distribution array 202 and the die paddle 104. Since the bypass capacitance provided by the bypass distribution array is very near to the IC, and has only the minimal inductance and resistance of the first conductive layer 208, the voltage drop suffered by prior art solutions is avoided. Although not specifically illustrated in FIGS. 3 and 4, for proper operation of the IC die 102, one or more ground bond wires are connected between ground pads on the die 102 and the die paddle 104, and between the die paddle 104 and ground fingers 110 on the QFP lead frame 106.

Figure 5:
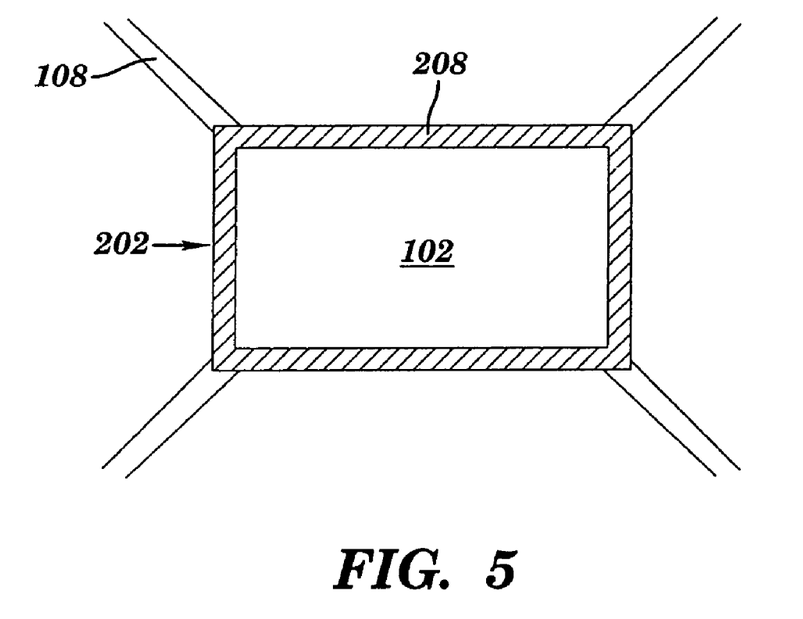
FIG. 5 illustrates a top view of QFP packaging assembly with a bypass distribution array that covers the underlying die paddle.
Figure 6:
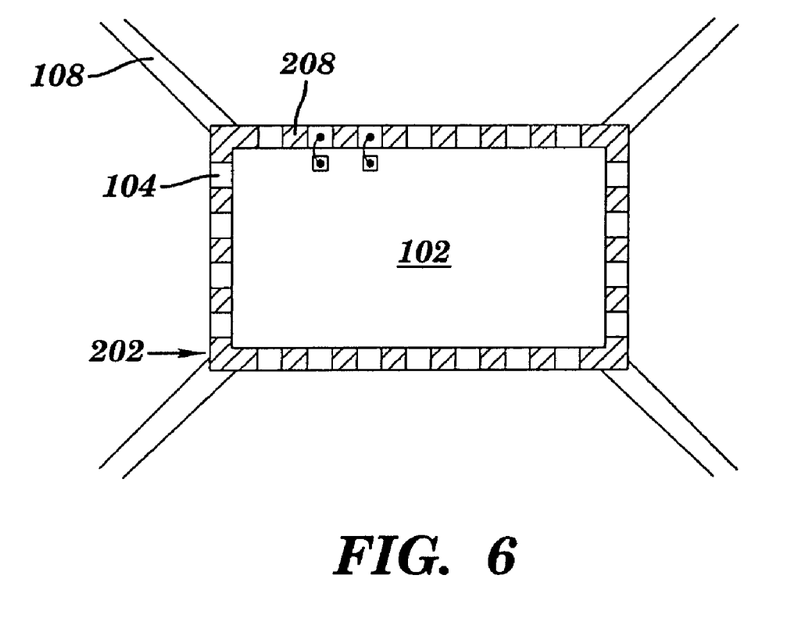
FIG. 6 is a top view of a QFP packaging assembly with a bypass distribution array that covers the underlying die paddle as shown in FIG. 5, but including notched portions in accordance with a further embodiment of the invention.

Depending on the size and configuration of the IC die 102, it is possible that the resulting bypass distribution array 202 is about the same size and configuration as the die paddle 104 underneath. Such a scenario is illustrated in FIG. 5, wherein the die paddle (not shown in the top view FIG. 5) is totally covered or nearly covered by the bypass distribution array 202. However, if a ground connection (for example) is desired from the die paddle directly to the die 102, the configuration of FIG. 5 presents an obstacle to such a connection. Accordingly, FIG. 6 illustrates an alternative embodiment of the bypass distribution array 202, in which portions of the array are removed or "notched out" so as to expose the die paddle 104 underneath adjacent to ground pads of IC 102. This in turn allows selected areas atop the die 102 to be connected to the grounded die paddle 104. In an alternative embodiment, bond wires (not shown) connect the notched out areas to ground lead fingers of the QFP lead frame (not shown), thusly, grounding the die paddle.

Figure 7:
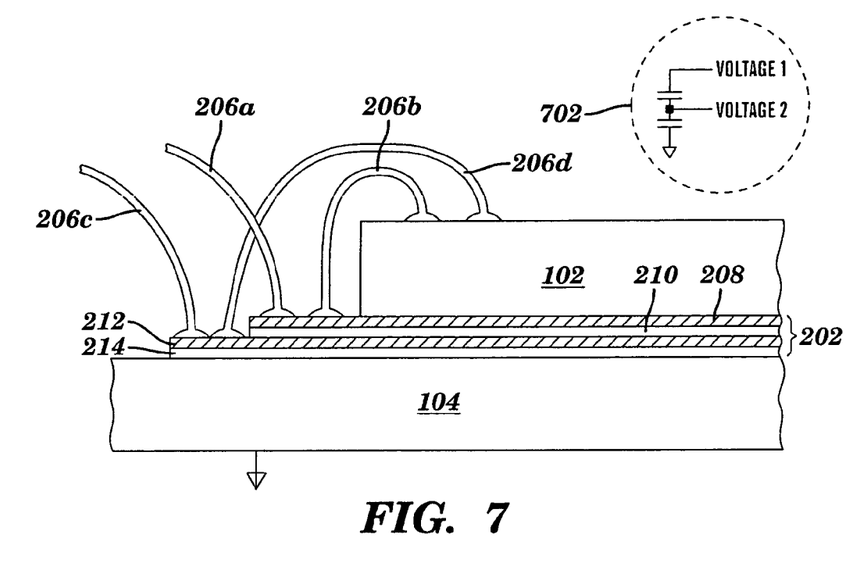
FIG. 7 is a side view of an alternative, multilayer embodiment of the bypass distribution array.

Referring now to FIG. 7, there is shown still an alternative embodiment of the bypass distribution array 202, in which multiple conductive and insulative/dielectric layers are employed. As is shown, the first conductive layer 208 is formed on the first insulative layer 210, similar to the previously described embodiments. However, in this embodiment, the first insulative layer 210 is in turn formed over a second conductive layer 212 of the bypass array 202. The second conductive layer 212 is formed over a second insulative layer 214 of the bypass array, the second insulative layer 214 being formed on the die paddle 104.

The first conductive layer 208 of the bypass array 202 may, as indicated above, be used to route the chip supply voltage to desired locations on the IC die 102 through leads 206a and 206b. In addition, the presence of the second conductive layer 212 allows for a different voltage to be efficiently routed to selected locations on the die 102, as is the case with the first (e.g., supply) voltage. This may be carried out, for example, through bond leads 206c and 206d. It will be noted then, that leads 206a and 206c originate from pins (fingers) having different voltages thereon.

With regard to the bypass capacitance function of the array 202, the presence of the second conductive layer 212 results in an equivalent series capacitance between a first capacitor defined by conductive layer 208, first insulative layer 210 and second conductive layer 212, and a second capacitor defined by second conductive layer 212, second insulative layer 214, and die paddle 104. An equivalent circuit thereof is shown in the circled insert 702 of FIG. 7, with Voltage 1 representing the voltage on the first conductive layer 208 (e.g., $V_{CC}$) and the Voltage 2 represent a different voltage on the second conductive layer 212. In such a series configuration, it may be the case that noise on Voltage 1 could induce noise on Voltage 2. In the event that this condition is undesirable, FIG. 8 illustrates still a further embodiment of the bypass distribution array 202, in which multiple voltages are available for distribution to the IC die, but with a much-reduced resulting series capacitance.

Figure 8:
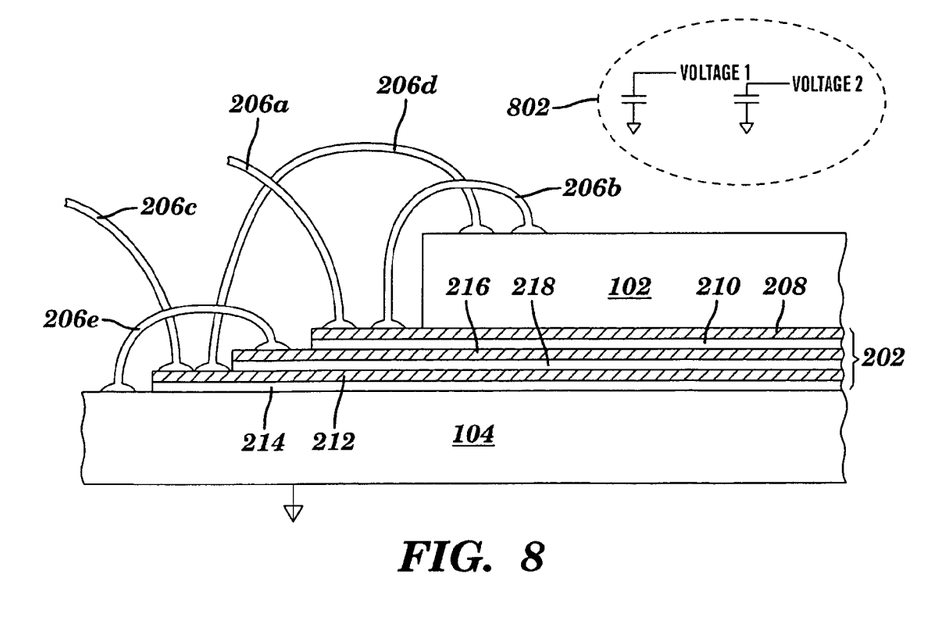
FIG. 8 is a side view of still another multilayer embodiment of the bypass distribution array.

As is particularly shown in FIG. 8, this embodiment features three pairs of conductive/insulative layers within the bypass distribution array 202. For example, first conductive layer 208 is still used to distribute a first voltage level to the die 102, and second conductive layer 212 is still used to distribute a second voltage level to the die 102 as is the case in FIG. 7. However, in addition, a third conductive layer 216 and corresponding insulative/dielectric layer 218 is now interposed between the first and second pairs of conductive/insulative layers within the bypass distribution array 202. Moreover, through bond lead 206e, the third conductive layer 216 is coupled to the grounded die paddle 104. Not only does this provide additional locations through which a ground voltage can be distributed to the IC die 102, but the intermediate ground layer also results in an equivalent bypass capacitance circuit in which the capacitors defined by the first and second voltages are in parallel with one another instead of in series. The insert 802 of FIG. 8 illustrates the equivalent bypass capacitance circuit of this embodiment.

It will further be appreciated that, in embodiments where multiple conductive/insulative layer pairs are used within the bypass distribution array 202, and where the area of the array 202 is a concern with respect to the die paddle 104, the notching technique described in the embodiment of FIG. 5 could also be applied to provide access to one or more intermediate layers within the distribution array 202.

Figure 9:
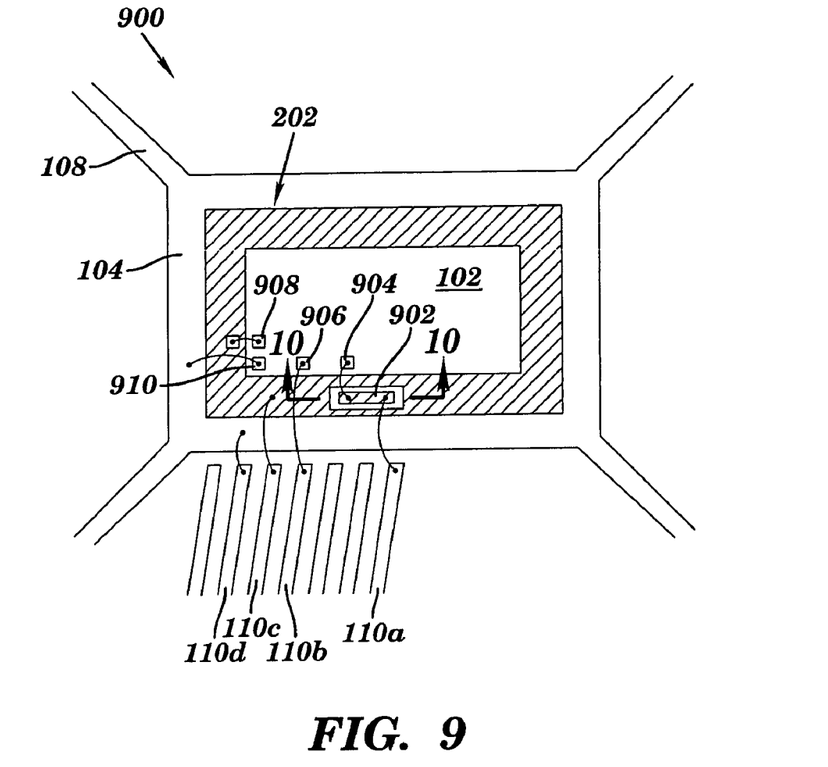
FIG. 9 is a top view of a QFP packaging assembly featuring still another embodiment of the bypass distribution array.
Figure 10:
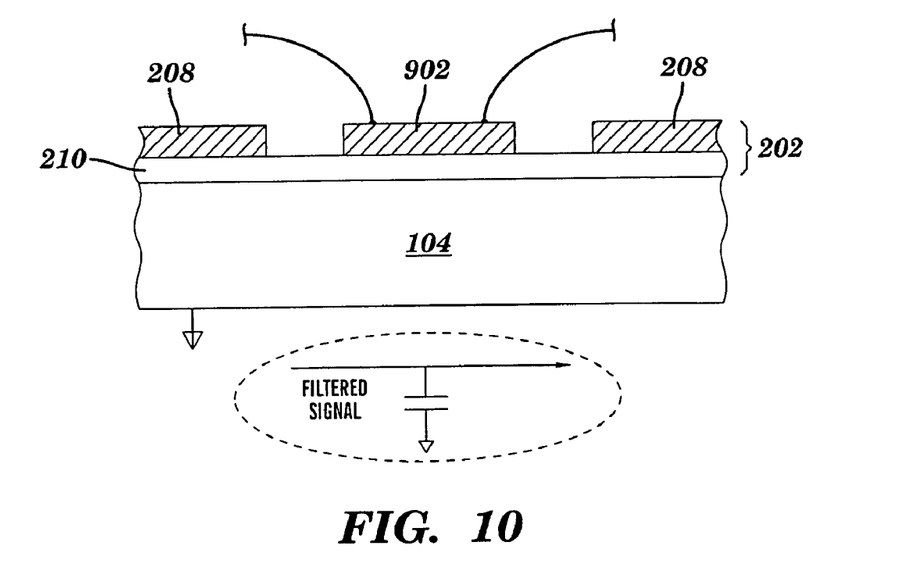
FIG. 10 is a side sectional view of the portion of the bypass distribution array taken along the arrows of FIG. 9.

Finally, FIGS. 9 and 10 illustrate still a further embodiment of a QFP packaging assembly 900 with a bypass distribution array. In this embodiment, the bypass distribution array 202 features an isolated island 902, in which a portion of the conductive layer 208 is isolated from the main layer. This island 902 could be formed, for example, by well-known semiconductor patterning techniques, among others. One possible application for island 902 is to serve as a small filter capacitor to ground for RFI filtering. In this manner, an outgoing signal from the ASIC die 102 (through pad 904) is coupled to the small island 902 (configured as a small capacitor), and out to finger 110a of the package 900. The island 902 is shown in further detail in FIG. 10, which also includes the equivalent circuit for the filter capacitor.

By way of comparison to other functions, FIG. 9 further illustrates an unfiltered signal from pad 906 of die 102 to another package finger 110b. In accordance with the earlier descriptions, a voltage supply finger 110c provides power to the bulk of the top conductor layer of bypass distribution array 202 (which could also serve as a bypass capacitor as discussed in the embodiments above). At pad 908, a connection is made from the supply voltage distributed by the array 202 to the die 102. Where the die paddle 104 provides sufficient room for a ground connection, this is distributed directly to the die 102 at pad 910 (through finger 110d). Alternatively, if the die paddle 104 is relatively small in area, the bypass distribution array 202 may be patterned as needed so as to expose one or more portions of the die paddle 104.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated circuit packaging apparatus, comprising:
a lead frame comprising a conductive die paddle electrically connected to ground, and at least first and second conductive leads electrically connected to first and second voltages, respectively;
an integrated circuit die positioned over the die paddle;
a first conductive layer disposed between the integrated circuit die and the conductive die paddle;
a first bond wire electrically connecting the first conductive layer to the first conductive lead;
a second bond wire electrically connecting the first conductive layer to the integrated circuit die and configured to distribute the first voltage thereto; and
a first dielectric layer disposed between the first conductive layer and the conductive die paddle such that the first conductive layer, the first dielectric layer, and the conductive die paddle are configured to provide bypass capacitance for the first voltage.

2. The apparatus of claim 1, further comprising:
at least one of the first conductive layer and the first dielectric layer having one or more notches defined therein to expose one or more areas of the conductive die paddle to facilitate electrical connection thereto.

3. The apparatus of claim 1, further comprising:
a second conductive layer disposed between the first conductive layer and the integrated circuit die;
a third bond wire connecting the second conductive layer to the second conductive lead;
a fourth bond wire connecting the second conductive layer to the integrated circuit die and configured to distribute the second voltage thereto; and
a second dielectric layer disposed between the second conductive layer and the first conductive layer such that the second conductive layer, the second dielectric layer, and the first conductive layer are configured to provide bypass capacitance for the second voltage, wherein the bypass capacitance for the second voltage is in series with the bypass capacitance for the first voltage.

4. The apparatus of claim 1, further comprising:
a second conductive layer disposed between the first conductive layer and the integrated circuit die;
a second dielectric layer disposed between the second conductive layer and the first conductive layer;
a fourth bond wire connecting the second conductive layer to the conductive die paddle such that the conductive die paddle is electrically connected to the second conductive layer;
a third conductive layer disposed between the second conductive layer and the integrated circuit die;

a fifth bond wire connecting the third conductive layer to the second conductive lead or another conductive lead configured to provide the second voltage;

a sixth bond wire connecting the third conductive layer to the integrated circuit die and configured to distribute the second voltage at the third conductive layer to the integrated circuit die; and a third dielectric layer disposed between the third conductive layer and the second conductive layer such that the third conductive layer, the third dielectric layer, and the second conductive layer are configured to provide bypass capacitance for the second voltage, wherein the bypass capacitance for the first voltage is not is series with the bypass capacitance for the second voltage.

5. The apparatus of claim 1, wherein the first conductive layer has a portion thereof electrically isolated from the remainder of the first conductive layer, the portion of the first conductive layer, the first dielectric layer, and the conductive die paddle being configured to provide filter capacitance for the integrated circuit die.

6. The integrated circuit packaging apparatus of claim 1 is a quad flat pack (QFP) packaging assembly.

* * * * *